US008467252B2

(12) United States Patent

Incarnati et al.

(10) Patent No.: US 8,467,252 B2

(45) **Date of Patent: *Jun. 18, 2013**

(54) WORD LINE ACTIVATION IN MEMORY DEVICES

(75) Inventors: Michele Incarnati, Gioia dei Marsi (IT); Giovanni Santin, Vazia (IT)

(73) Assignee: Micro Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/285,871

(22) Filed: Oct. 31, 2011

(65) Prior Publication Data

US 2012/0044765 A1 Feb. 23, 2012

Related U.S. Application Data

(63) Continuation of application No. 11/945,441, filed on Nov. 27, 2007, now Pat. No. 8,050,102.

(30) Foreign Application Priority Data

Jul. 10, 2007 (IT) ............................ RM2007A0382

(51) Int. Cl.

*G11C 16/06* (2006.01)
*G11C 16/08* (2006.01)

(52) U.S. Cl.

USPC ............ 365/185.23; 365/185.11; 365/185.13; 365/185.17; 365/185.18

(58) Field of Classification Search

USPC ............ 365/185.02, 185.11, 185.13, 185.17, 365/185.18, 185.23, 185.25

See application file for complete search history.

(56) References Cited

U.S. PATENT DOCUMENTS

| | | | | |
|---|---|---|---|---|
| 6,044,017 | A | 3/2000 | Lee et al. | |
| 8,050,102 | B2 * | 11/2011 | Incarnati et al. | 365/185.23 |
| 2005/0141283 | A1 | 6/2005 | Lee et al. | |
| 2006/0245260 | A1 | 11/2006 | Kim | |
| 2007/0147118 | A1 | 6/2007 | Pham et al. | |

* cited by examiner

*Primary Examiner* — J. H. Hur

(74) *Attorney, Agent, or Firm* — Leffert Jay & Polglaze, P.A.

(57) ABSTRACT

Memory devices and methods, such as those facilitating flexibility in applying differing biasing schemes to word lines. For example, one such memory device can include an architecture capable of partitioning word lines into one of a plurality of address spaces. Each address space has a corresponding configuration control bus. By identifying the address space to which a word line belongs, its appropriate configuration control bus may be selected and the control signals from the selected bus used to select the appropriate potentials for driving the word lines.

21 Claims, 8 Drawing Sheets

315₁₅
GWL15 Decoder
372₁₅
Unsel
402
Sel+1 dec
Sel dec
Sel-1 dec
Sel-2 dec
401a
401b
401c
401d
Sel+1 dec en
Sel-1 dec en
Sel-2 dec en
b4
b3
b2
b1
b0
202
GWL ADD

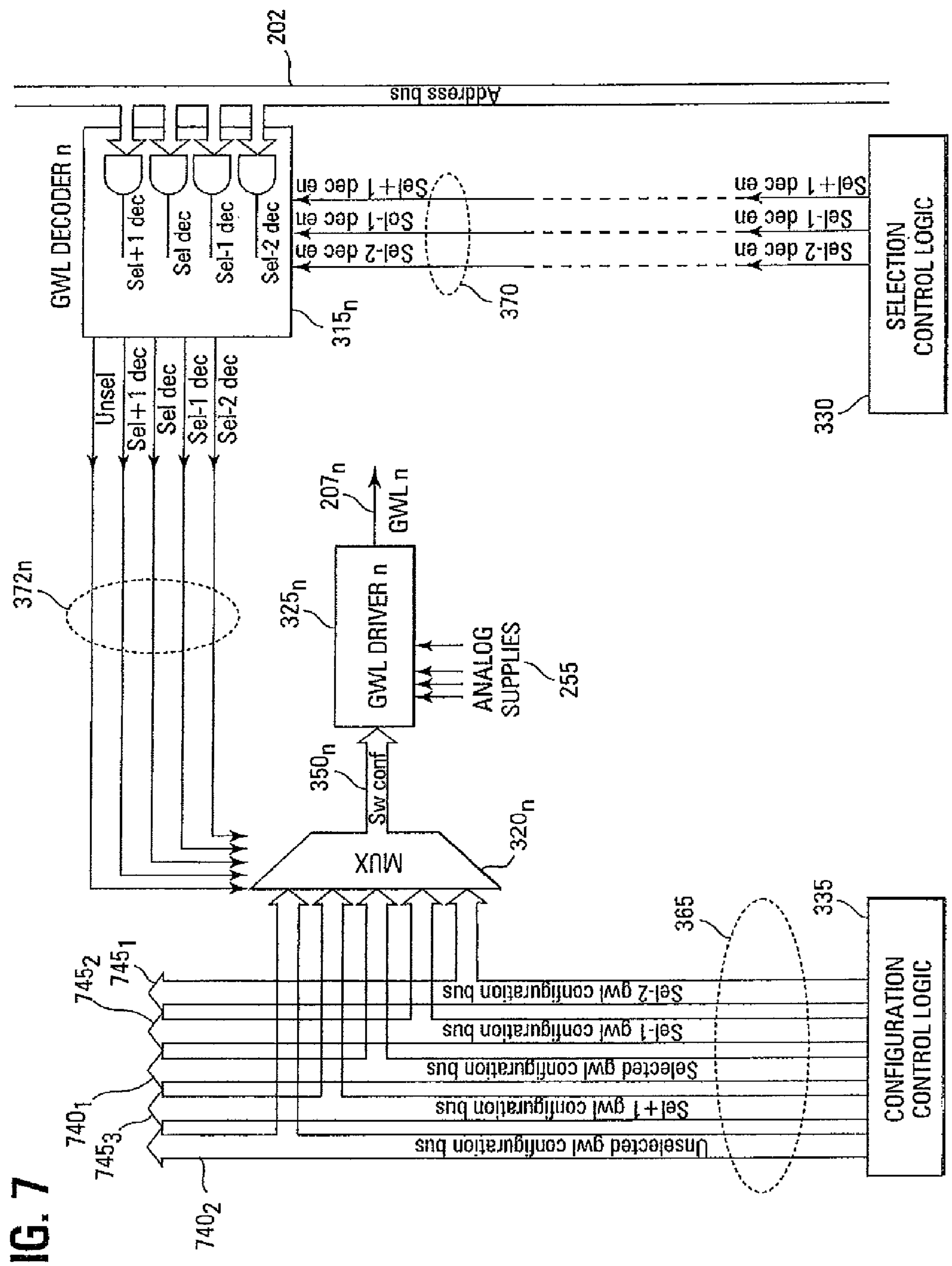
FIG. 7
202
Address bus
GWL DECODER n
Sel+1 dec
Sel dec
Sel-1 dec
Sel-2 dec
Sel+1 dec en
Sel-1 dec en
Sel-2 dec en
315n
370
SELECTION CONTROL LOGIC
330
Unsel
Sel+1 dec
Sel dec
Sel-1 dec
Sel-2 dec
372n
207n
GWL n
GWL DRIVER n
325n
ANALOG SUPPLIES
255
350n
Sw conf
MUX
320n
365
335
CONFIGURATION CONTROL LOGIC
Sel-2 gwl configuration bus
Sel-1 gwl configuration bus
Selected gwl configuration bus
Sel+1 gwl configuration bus
Unselected gwl configuration bus
7452
7451
7401
7453
7402

WORD LINE ACTIVATION IN MEMORY DEVICES

RELATED APPLICATIONS

This application is a continuation of U.S. application Ser. No. 11/945,441, filed Nov. 27, 2007 now U.S. Pat. No. 8,050,102, titled "Word Line Activation in Memory Devices" (allowed), which is commonly assigned and incorporated herein by reference. This application further claims priority to Italian Patent Application Serial No. RM2007A000382, filed Jul. 10, 2007, entitled "Word Line Activation in Memory Devices," which is commonly assigned.

TECHNICAL FIELD

The present disclosure relates generally to memory devices, and in a particular embodiment, the present disclosure relates to methods and apparatus for providing reconfigurable word line activation in non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming or "writing" of charge storage or trapping layers or other physical phenomena, determine the data value of each cell. By defining two or more ranges of threshold voltages to correspond to individual data values, one or more bits of information may be stored on each cell. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

For the reasons stated above, and for other reasons that will become apparent to those skilled in the art upon reading and understanding the present specification, there is a need in the art for alternative memory architectures such as those to facilitate reconfigurable activation of word lines for accessing non-volatile memory devices.

BRIEF DESCRIPTION OF THE DRAWINGS

FIG. 7 is block schematic of a portion of the global word line selection and activation circuitry of FIG. 3 showing additional detail of the configuration busses according to an embodiment of the disclosure.

DETAILED DESCRIPTION

Figure 1:
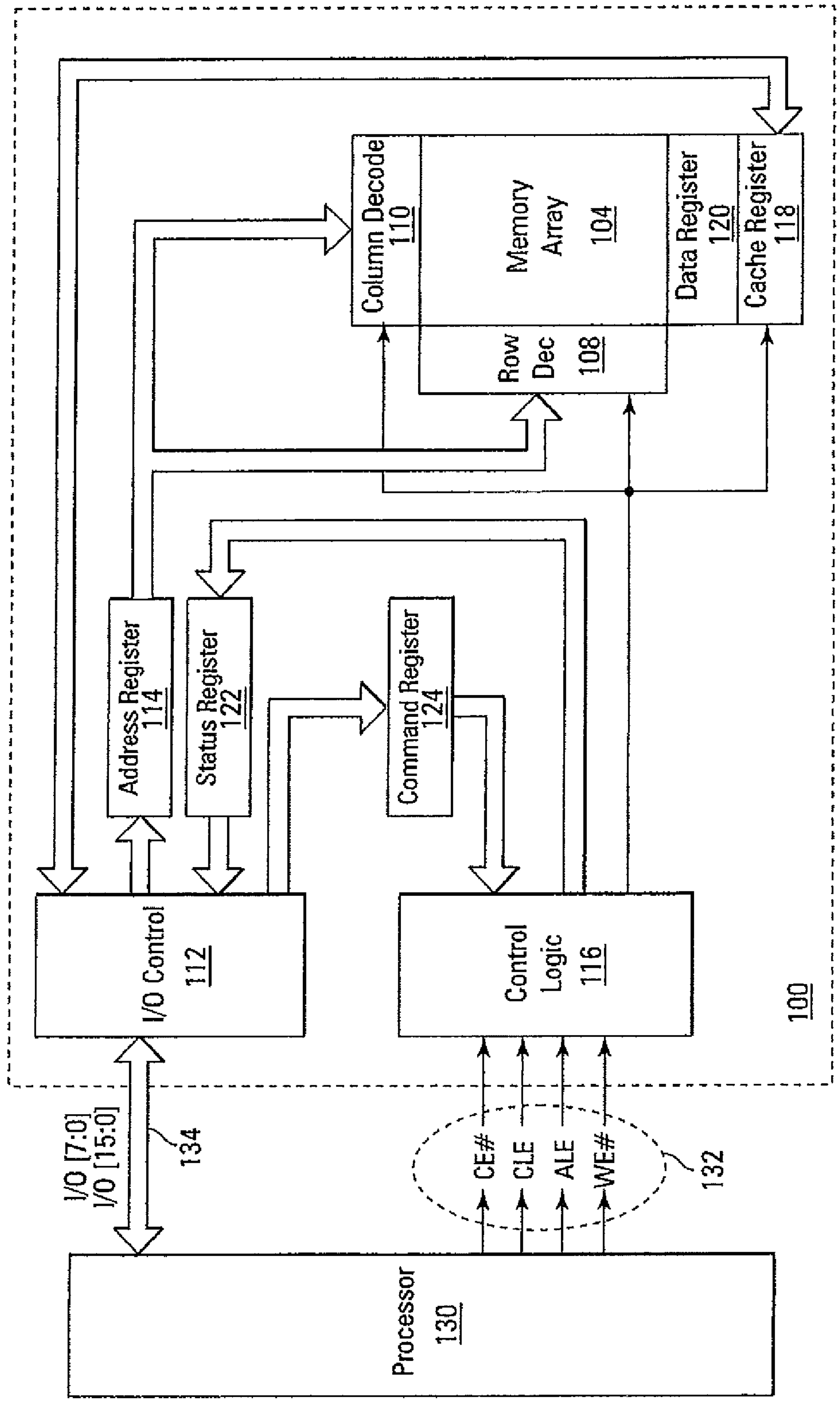
FIG. 1 is a simplified block diagram of a memory device coupled to a processor as part of an electronic system, according to an embodiment of the disclosure.

In the following detailed description of the present embodiments, reference is made to the accompanying drawings that form a part hereof, and in which is shown by way of illustration specific embodiments in which the disclosure may be practiced. These embodiments are described in sufficient detail to enable those skilled in the art to practice the embodiments of the invention, and it is to be understood that other embodiments may be utilized and that process, electrical or mechanical changes may be made without departing from the present disclosure. The following detailed description is, therefore, not to be taken in a limiting sense.

The various embodiments explicitly described herein facilitate flexibility in applying differing biasing schemes to global word lines of a non-volatile memory device. Global word lines are selectively coupled to one or more word lines coupled to the memory cells. Global word lines are used to transfer the drive potentials to one of their associated word lines. Word lines are conductive lines used to access memory cells and may be referred to herein as access lines. In general, when accessing memory cells within a block of memory cells, different sets of word lines within the block are biased with different voltages depending upon the desired operation and the relation of the set of word lines to a target (e.g., a selected) word line. For example, during a read operation, a selected word line associated with the memory cells targeted for the read operation would receive a first voltage, such as a read or verify voltage, designed to activate a target memory cell if it is in a first data state and to leave a target memory cell deactivated if it is in a second data state. Remaining word lines of the block would receive a second voltage, such as a read pass voltage, designed to activate each memory cell associated with those word lines regardless of their data state.

Other access operations of the memory device may require similar or quite different address spaces. For example, a program operation may apply a first voltage to a selected word line, such as a program voltage, designed to change the data state of any memory cell associated with that word line if it is not program inhibited, while applying a second voltage to unselected/remaining word lines of the block, such as a program pass voltage, designed to activate each memory cell associated with those word lines while not generating sufficient biasing to alter the program state of those memory cells, regardless of whether they are program inhibited. There are also more complex program operations where the selected word line receives a first voltage, an adjacent word line receives a second voltage and remaining unselected word lines receive a third voltage; where the selected word line receives a first voltage, a first adjacent word line receives a second voltage, a second adjacent word line receives a third voltage and remaining unselected word lines receive a fourth voltage; and where a selected word line receives a first voltage, an upper adjacent word line receives a second voltage, a lower adjacent word line receives a third voltage, a next lower adjacent word line receives a fourth voltage and remaining unselected word lines receive a fifth voltage. However, the various embodiments described herein are not reliant on any particular access scheme and are therefore not limited to any specific partitioning of the address space and can be modified to accommodate any desired access scheme. While the embodiments will be described in relation to an architecture capable of partitioning the word lines into up to five address spaces, architectures supporting fewer or more partitions are in accordance with the embodiments of this disclosure. In general, partitioning is based on a relationship of various word lines to the target word line. For example, in access operations such as those described above, the relationship may be based on relative positions of the word lines. Word line positions will be described herein using numeric and relative terminology. The numeric description of word line position relates generally to the sequence in which the word lines of a set (such as the word lines of a NAND string) would be programmed. For example, if a NAND string is generally programmed in a direction from its source end to its drain end during a write operation, the word lines would be numbered starting from the source end and proceeding incrementally to the drain end. The numbering convention normally used starts with 0, such that a set of word lines having 32 members would be numbered from 0 to 31. Similarly, when relative terminology is used herein to describe the physical relationship between two word lines, upper and higher refer to word line positions of higher numeric value while lower refers to word line positions of lower numeric value.

FIG. 1 is a simplified block diagram of a memory device 100 in communication with (e.g., coupled to) a processor 130 as part of an electronic system, according to an embodiment of the disclosure. Some examples of electronic systems include personal computers, personal digital assistants (PDAs), digital cameras, digital media players, digital recorders, games, appliances, vehicles, wireless devices, mobile telephones, memory modules and the like. The processor 130 may be a memory controller or other external processor.

Memory device 100 includes an array of memory cells 104 arranged in rows and columns. The array of memory cells 104 includes isolation structures in accordance with one or more of the various embodiments. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays.

A row decode circuitry 108 and a column decode circuitry 110 are provided to decode address signals. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses. Control logic 116 and row decode circuitry 108 are adapted to perform methods in accordance with one or more embodiments of the disclosure.

Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE#. Memory device 100 receives commands (in the form of command signals), addresses (in the form of address signals), and data (in the form of data signals) from processor 130 over a multiplexed input/output (I/O) bus 134 and outputs data to processor 130 over I/O bus 134.

Specifically, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device. It will be appreciated by those skilled in the art that additional circuitry and signals can be provided, and that the memory device of FIG. 1 has been simplified to help focus on the present disclosure. Additionally, while the memory device of FIG. 1 has been described in accordance with popular conventions for receipt and output of the various signals, it is noted that the various embodiments are not limited by the specific signals and I/O configurations described unless expressly noted herein.

Figure 2:
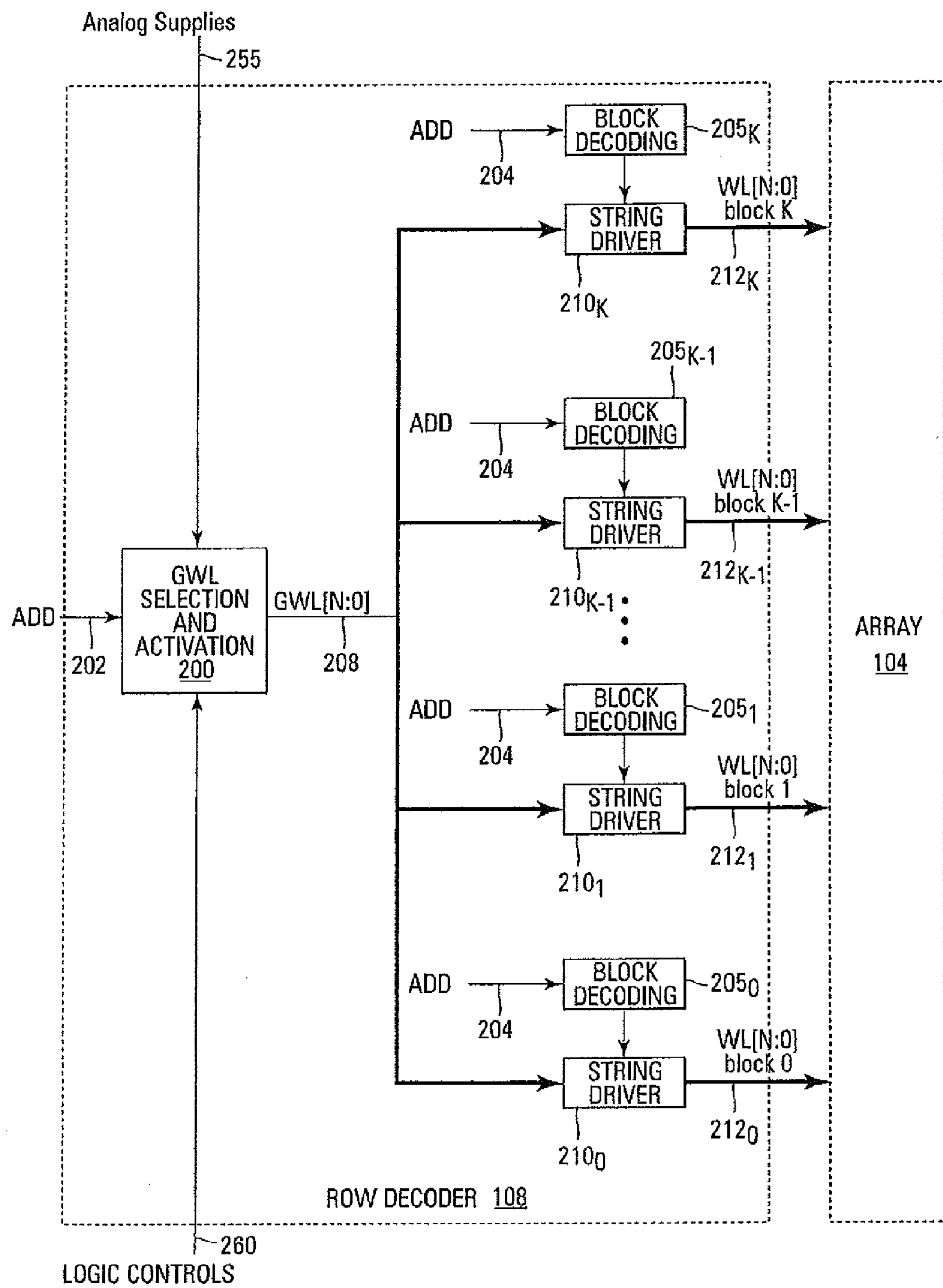
FIG. 2 is a block schematic of a row decoder coupled to an array according to an embodiment of the disclosure.

FIG. 2 is a block schematic of a row decoder 108 coupled to an array of memory cells 104 according to an embodiment of the disclosure. The row decoder 108 is coupled to receive address signals 202, such as from address register 114 of FIG. 1, at global word line (GWL) selection and activation circuitry 200. Address signals 202 may include all address signals from the address register 114. However, GWL selection and activation circuitry 200 may only receive a portion of the address signals from the address register 114, such as those signals indicative of a target word line.

GWL selection and activation circuitry 200 is further coupled to receive a set of control signals, such as logic control signals 260 and a set of analog supply potentials 255. In response to the logic control signals 260, the GWL selection and activation circuitry 200 provides a set of GWL potentials 208 at its output for use in driving word lines of one or more selected blocks of memory cells. The GWL potentials 208 are a composite of individual word line potentials, including one potential for each of the N word lines of a block of memory cells. For example, if a NAND string of a block of memory cells includes 32 memory cells, the GWL potentials 208 would include 32 potentials to drive the word lines associated with each of the memory cells of the NAND string.

The GWL potentials 208 are provided to one or more string drivers 210, which are typically high voltage switches designed to pass the full input potential of the GWL potentials 208 as local word line potentials 212. There would generally be a one-to-one correspondence between the string drivers 210 and the blocks of the array 104 to which the GWL selection and activation circuitry 200 is intended to supply. Thus, if the GWL selection and activation circuitry 210 is intended to service K blocks of memory cells of the array 104, there would be K string drivers 210.

Each string driver 210 is selectively activated by an associated block decoder 205 in response to address signals 204. Address signals 204 may include all address signals from the address register 114. However, the block decoders 205 may only receive a portion of the address signals from the address register 114, such as those signals indicative of a block of memory cells. Generally, only one of the K string drivers 210 would be activated at a time, thus coupling the GWL potentials 208 of the GWL selection and activation circuitry 200 to the word lines of one block of memory cells of the array 104.

Figure 3:
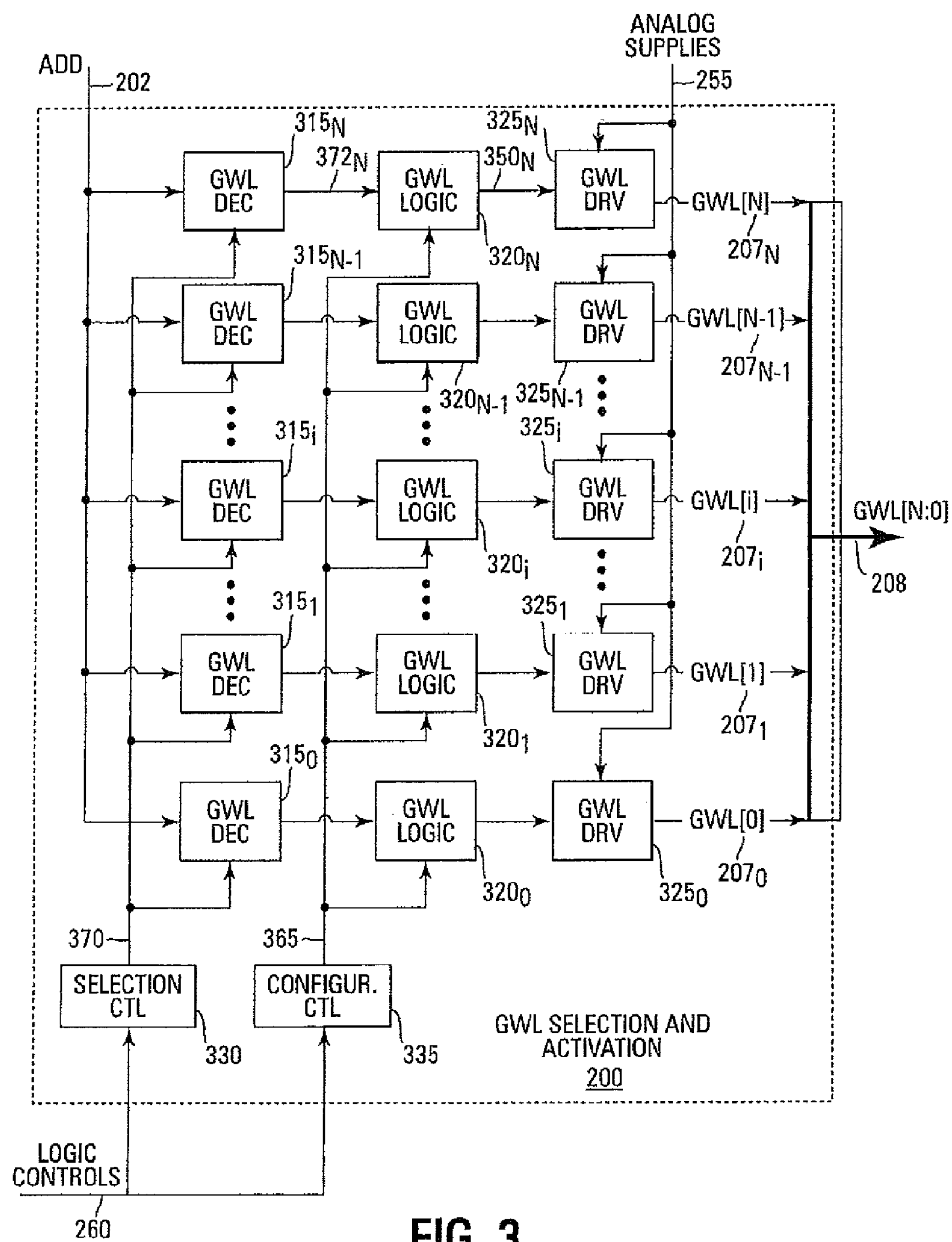
FIG. 3 is a block schematic of a global word line selection and activation circuitry according to an embodiment of the disclosure.

FIG. 3 is a block schematic of a GWL selection and activation circuitry 200 according to an embodiment of the disclosure. FIG. 3 provides further detail on the generation of individual GWL potentials 207 of the set of GWL potentials 208. For each of its N word lines, the GWL selection and activation circuitry 200 includes a GWL decoder 315. Each decoder 315 is responsive to address signals 202 and selection control signals 370 to generate control signals 372 indicative of the address space to which a word line belongs. In addition, for each of its N word lines, the GWL selection and activation circuitry 200 includes a GWL logic block 320. Each logic block 320 is generally a multiplexer to select a desired set of configuration control signals 350 from a plurality of configuration control busses 365 in response to the control signals 372, thus selecting a set of configuration control signals 350 associated with the corresponding address space of word line. For each of its N word lines, the GWL selection and activation circuitry 200 further includes a GWL driver 325. Each driver 325 is generally a multiplexer to select a potential from the analog supplies 255 in response to the configuration control signals 350, thus providing the selection potential as the individual GWL potential 207.

The selection control signals 370 may be hard coded by the selection control block 330, such as through the use of fusible links or programmable non-volatile registers to determine what inhibit scheme is to be used during access operations, and thus which of the address spaces are applicable in accessing the memory array. Alternatively, the selection control block 330 may be a logic block responsive to logic control signals 260 to generate the selection control signals 370. For another embodiment, the selection control block 330 provides some of the selection control signals 370 as hard-coded signals while providing remaining selection control signals 370 in response to logic control signals 260.

The configuration control signals of the configuration control busses 365 may also be hard coded, e.g., the configuration control block 335 may use fusible links or non-volatile registers to determine the states of individual configuration control signals of each configuration control bus 365. Alternatively, the configuration control block 335 may be a logic block responsive to logic control signals 260 to generate the configuration control signals of the configuration control busses 365. For another embodiment, the configuration control block 335 provides some of the configuration control signals of the configuration control busses 365 as hard-coded signals while providing remaining configuration control signals in response to logic control signals 260.

Figure 4:
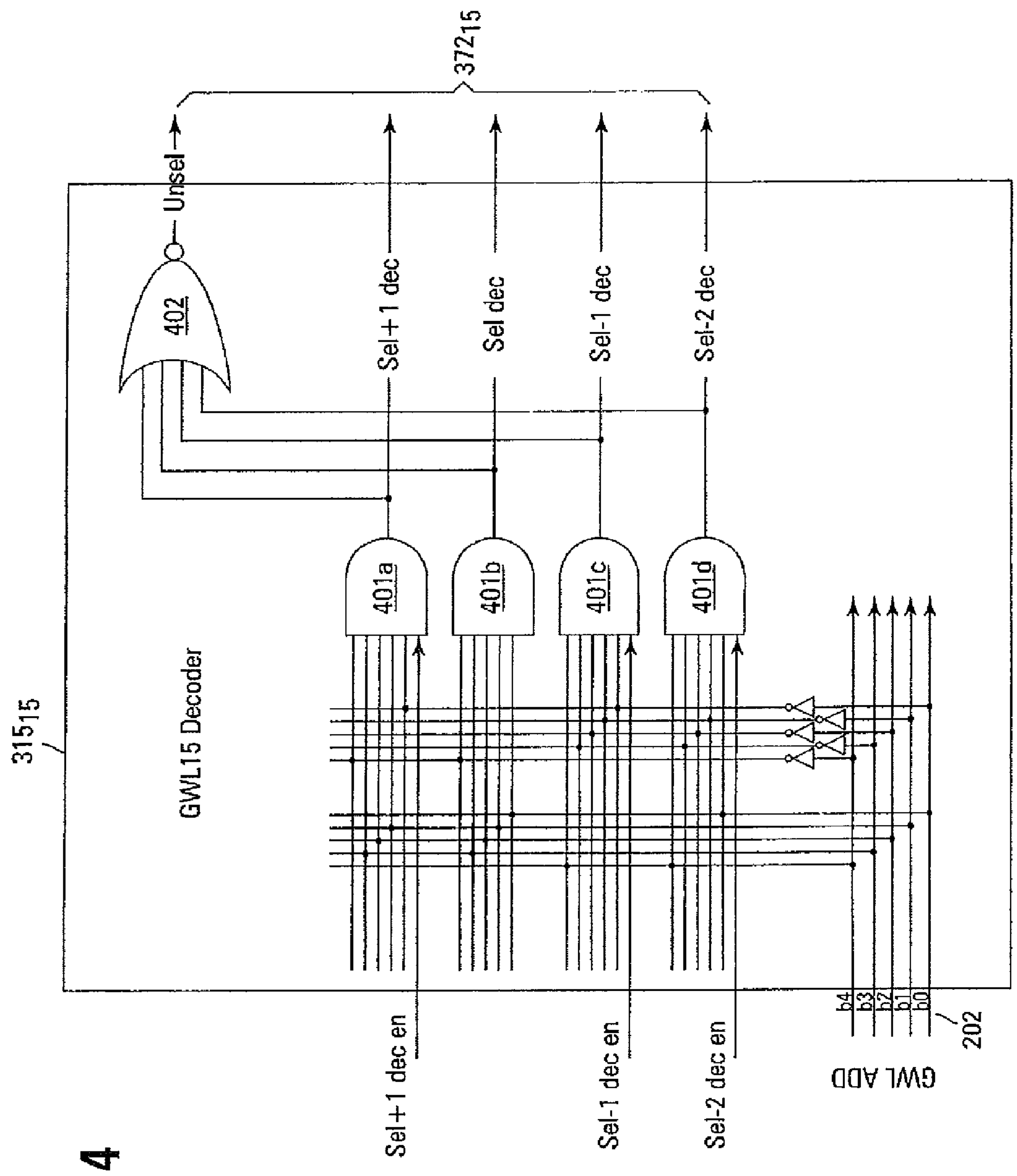
FIG. 4 is a combinatorial logic diagram of an example global word line decoder according to an embodiment of the disclosure.

FIG. 4 is a combinatorial logic diagram of an example GWL decoder according to an embodiment of the disclosure. For the example provided in FIG. 4, the GWL decoder $\mathbf{315}_{15}$ is representative of logic suitable for a word line having an address corresponding to a decimal value of 15. For the embodiment of FIG. 4, address signals 202, i.e., b0-b4, are provided to inputs of AND gates 401*a*-401*d* either as inverted signals or non-inverted signals such that AND gate 401*a* can only provide a logic 1 output when the address signals 202 are indicative of GWL 14 being selected (when the GWL of the decoder 315 is one higher than the selected GWL) and its enable signal Sel+1 dec en is logic 1, thus enabling the Sel+1 address space; AND gate 401*b* can only provide a logic 1 output when the address signals 202 are indicative of GWL 15 being selected; AND gate 401*c* can only provide a logic 1 output when the address signals 202 are indicative of GWL 16 being selected (when the GWL of the decoder 315 is one lower than the selected GWL) and its enable signal Sel−1 dec en is logic 1, thus enabling the Sel−1 address space; and AND gate 401*d* can only provide a logic 1 output when the address signals 202 are indicative of GWL 17 being selected (when the GWL of the decoder 315 is two lower than the selected GWL) and its enable signal Sel−2 dec en is logic 1, thus enabling the Sel−2 address space. A NOR gate 402 is coupled to receive outputs of the AND gates 401 and to provide a logic 1 output if the conditions of the address signals 202 and the selection control signals 370 are such that none of the AND gates 401 is providing a logic 1 output. Thus, it can be seen that the GWL decoder $\mathbf{315}_{15}$ of FIG. 4 will provide a set of output signals $\mathbf{372}_{15}$ indicative of the enabled address space to which its associated GWL 15 belongs. Further, it will be apparent in view of FIG. 4 that additional address spaces could be defined if desired.

Exceptions in decoding may be encountered where an address space defines a non-existing word line or distinctive word lines. For example, if the selected word line is GWL 1, then the Sel−2 address space does not exist. For one embodiment, logic may be added to the enable signals to disable those address spaces when they define a non-existing word line. For an alternate embodiment, GWL decoders may eliminate logic related to address spaces for non-existing word lines. An example of this embodiment can be seen in FIG. 5. For another example, different potentials may be desired when an address space defines a distinctive word line, such as a first or last word line. As used herein, first and last word lines are those word lines at position 0 and position N−1, respectively, for a set of word lines having N word lines. To further this example, when an address space defines GWL 0 or GWL 31 for blocks having 32 word lines, different potentials may be desired than if the address space defined some other word line due to their proximity to the select gates of the NAND string. For one embodiment, additional address spaces could be defined to select a different configuration bus when such a condition arose. For another embodiment, the configuration control logic could be modified to change the configuration control signals associated with that configuration bus when it corresponds to a distinctive word line. Such an embodiment will be described in more detail with reference to FIG. 8.

Figure 5:
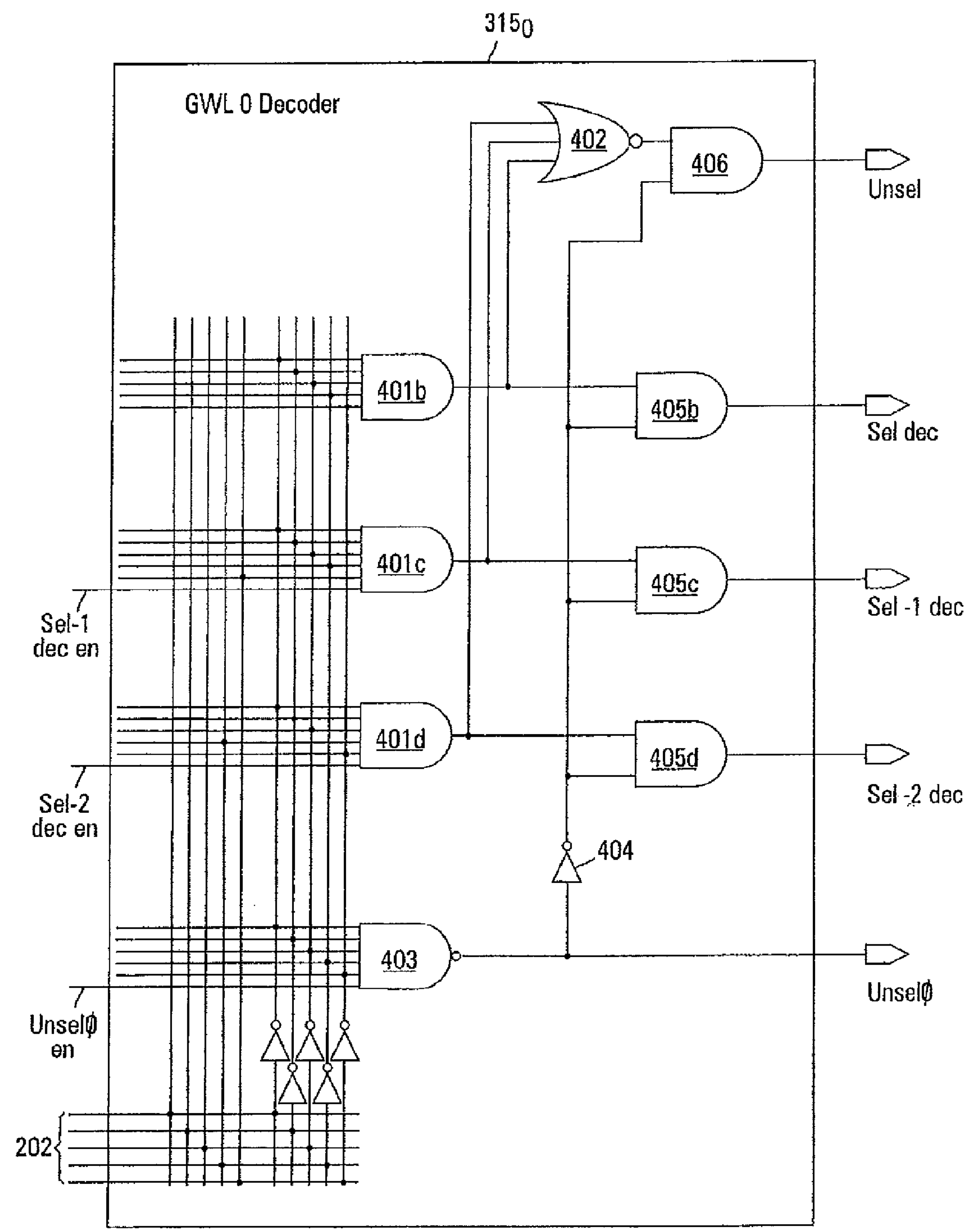
FIG. 5 is a combinatorial logic diagram of an example global word line decoder according to another embodiment of the disclosure.

For still another example, it may be desired to treat one or more word lines, such as a first and/or last word line, in one of two ways—using a first set of configuration control signals for a word line when it is selected and using a second set of configuration control signals for that word line when it is not selected, regardless of whether it belongs to any other enabled address space. For one embodiment, this situation can be handled by adding a corresponding configuration control bus and configuring the GWL decoder to provide control signals indicative of a desire to use the Sel dec configuration control bus when that word line is selected and to use the added configuration control bus when that word line is not selected. Note that the added configuration control bus may service more than one word line. For example, both the first and last word lines may utilize the added configuration control bus when unselected. For an alternate embodiment, logic can be added to the GWL decoder to provide this special handling as an option. For such an embodiment, an additional enable signal can be provided to selectively enable use of the additional configuration control bus of the prior embodiment. FIG. 5 is a combinatorial logic diagram of an example GWL decoder according to such an embodiment of the disclosure.

For the example provided in FIG. 5, the GWL decoder $\mathbf{315}_0$ is representative of logic suitable for a word line having an address corresponding to a decimal value of 0. For the embodiment of FIG. 5, address signals 202 are provided to inputs of AND gates 401*b*-401*d* and NAND gate 403 either as inverted signals or non-inverted signals such that AND gate 401*b* can only provide a logic 1 output when the address signals 202 are indicative of GWL 0 being selected; AND gate 401*c* can only provide a logic 1 output when the address signals 202 are indicative of GWL 1 being selected (when the GWL of the decoder 315 is one lower than the selected GWL) and its enable signal Sel−1 dec ends logic 1, thus enabling the Sel−1 address space; AND gate 401*d* can only provide a logic 1 output when the address signals 202 are indicative of GWL 2 being selected (when the GWL of the decoder 315 is two lower than the selected GWL) and its enable signal Sel−2 dec en is logic 1, thus enabling the Sel−2 address space; and NAND gate 403 can only provide a logic 1 output when the address signals 202 are indicative of any word line other than GWL 0 being selected and its enable signal Unsel0 en is logic 1, thus enabling the Unsel0 address space. A NOR gate 402 is coupled to receive outputs of the AND gates 401 and to provide a logic 1 output if the conditions of the address signals 202 and the selection control signals 370 are such that none of the AND gates 401 is providing a logic 1 output. Note that unlike FIG. 4, there is no AND gate 401*a* corresponding to the Sel+1 address space as there is no word line where Sel+1 corresponds to GWL 0.

AND gates 405*b*-405*d* and 406 are coupled to received outputs of AND gates 401*b*-401*d* and NOR gate 402, respectively, at first inputs, and an output of inverter 404, being an inverted output of NAND gate 403, at second inputs. If the enable signal Unsel0 en is logic 0, thus disabling the NAND gate 403 from providing a logic 1, the output of the AND gates 405*b*-405*d* and 406 are controlled by the outputs of AND gates 401*b*-401*d* and NOR gate 402, respectively, thus permitting use of the address spaces Sel−1 and Sel−2 if enabled. However, if the enable signal Unsel0 en is logic 1 and the address signals 202 correspond to any address other than GWL 0, the output of NAND gate 403 is a logic 1, thus providing a control signal Unsel0 indicative of a desire to use the additional configuration control bus for the unselected first word line. And by providing the inverted signal to the AND gates 405*b*-405*d* and 406, each of the remaining configuration control signals will be indicative of a desire to disable the remaining configuration control buses for GWL 0. In view of the foregoing examples, it is clear that combinatorial logic could be easily developed for each global word line decoder and for a variety of address spaces.

Figure 6:
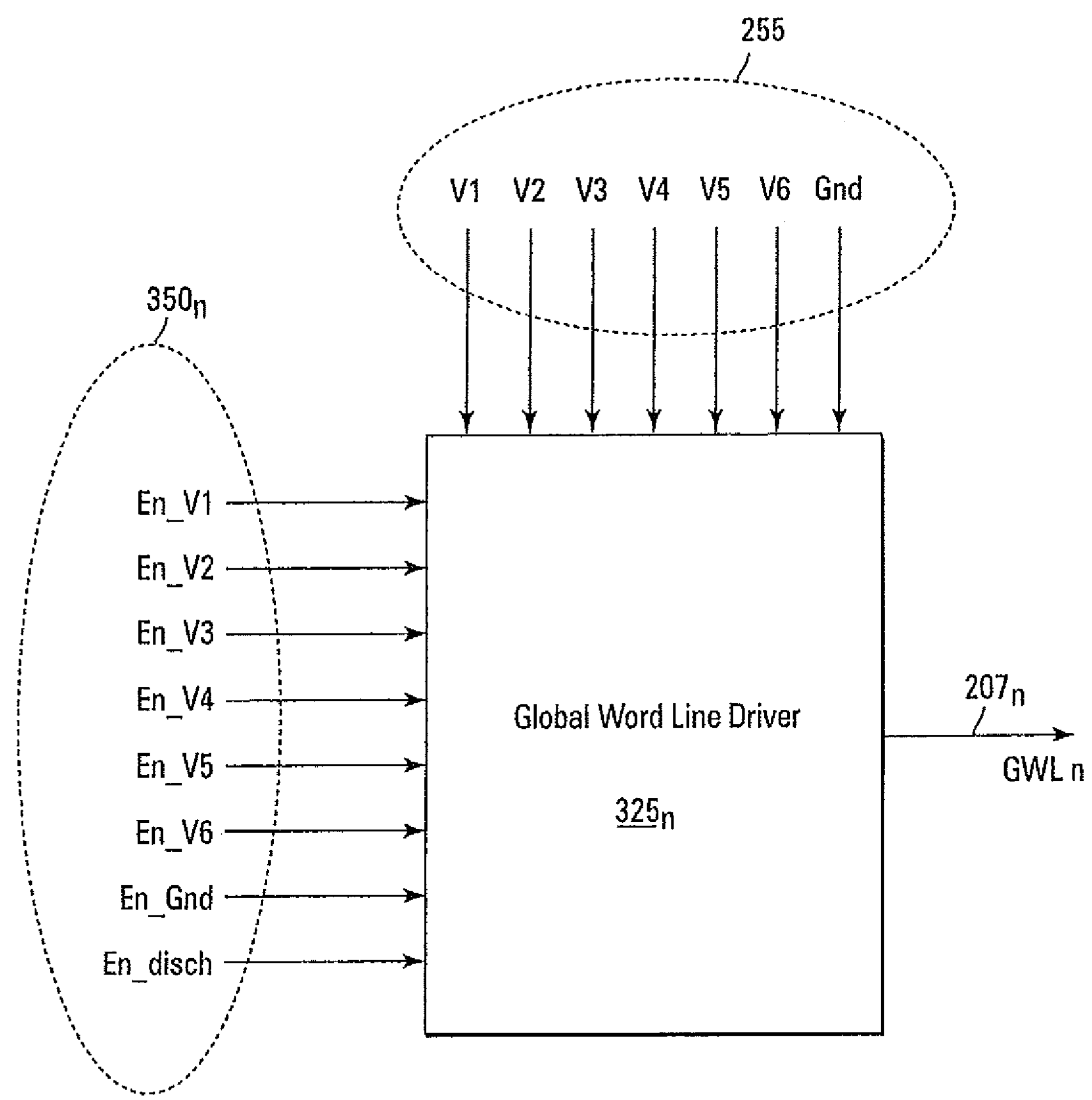
FIG. 6 is a block diagram of a global word line driver according to an embodiment of the disclosure.

FIG. 6 is a block diagram of a GWL driver 325*n* according to an embodiment of the disclosure. The GWL driver 325*n* is coupled to receive the selected set of configuration control signals 350*n* from a configuration bus associated with the address space to which the GWL n is determined to belong. The GWL driver 325*n* is further coupled to receive a set of analog supplies 255 representing a set of potentials available to apply to a word line. In response to the states of the individual control signals of the configuration control signals 350*n*, the OWL driver 325*n* provides a corresponding potential 207*n* to its associated GWL n. Note that the potential 207*n* need not be static during a given access operation and thus may represent a changing potential profile as the states of the individual control signals of the set of configuration control signals 350*n* change. For example, an access operation may require that the word line begin at a ground potential, shift to the potential V5 for a first phase of the operation and shift to the potential V2 for a second phase of the operation. By changing the control signals 350*n*, the resulting potential profile may be achieved at the output 207*n*.

FIG. 7 is block schematic of a portion of the GWL selection and activation circuitry 200 of FIG. 3 showing additional detail of the configuration busses 365 according to an embodiment of the disclosure. As shown, the configuration busses 365 are output from the configuration control logic block 335. For the example of FIG. 7, five configuration busses 365 corresponding to five possible address spaces are shown. Fewer or more configuration busses 365 may be used, depending upon how many separate address spaces are needed to control each access operation that the memory device is intended to support. The configuration busses 365 include first and second default configuration busses $\mathbf{740}_1$ and $\mathbf{740}_2$. The first default configuration bus $\mathbf{740}_1$ provides configuration control signals for operation of the selected word line. The second default configuration bus $\mathbf{740}_2$ provides configuration control signals for operation of any unselected word line that does not fall in to any other enabled address space. Remaining configuration buses 365, e.g., optional configuration buses $\mathbf{745}_1$-$\mathbf{745}_3$, provide configuration control signals for operation of word lines of their corresponding address spaces. Configuration buses $\mathbf{745}_1$-$\mathbf{745}_3$ are termed optional as their control signals will have no effect on the operation of a word line unless their corresponding address space is enabled. Thus, configuration bus $\mathbf{745}_1$ corresponding to the address space of a word line two lower than the selected word line will only effect the operation of a corresponding word line if selection control logic block 330 provides its corresponding enable signals Sel−2 dec en indicative of a desire to enable that address space; configuration bus $\mathbf{745}_2$ corresponding to the address space of a word line one lower than the selected word line will only effect the operation of a corresponding word line if selection control logic block 330 provides its corresponding enable signals Sel−1 dec en indicative of a desire to enable that address space; and configuration bus $\mathbf{745}_3$ corresponding to the address space of a word line one higher than the selected word line will only effect the operation of a corresponding word line if selection control logic block 330 provides its corresponding enable signals Sel+1 dec en indicative of a desire to enable that address space.

Figure 8:
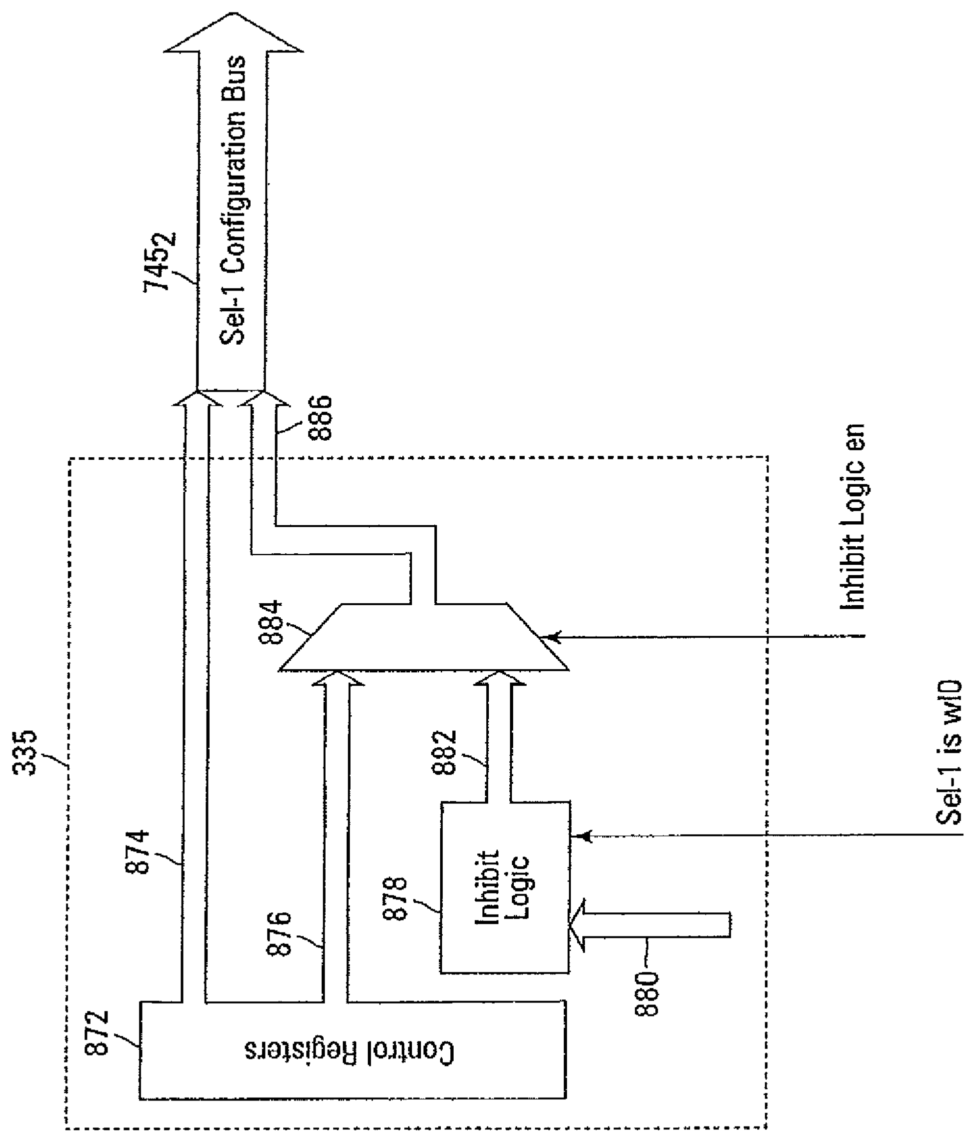
FIG. 8 is a block schematic showing generation of a configuration control bus according to an embodiment of the disclosure.

As noted previously, generation of configuration control buses 365 may take a variety of forms, and that their configuration control signals may vary based upon the selected word line. FIG. 8 is a block schematic showing generation of a configuration control bus according to an embodiment of the disclosure. In the example of FIG. 8, the configuration control bus is the configuration control bus $\mathbf{745_2}$ corresponding to the Sel−1 address space. In this example, configuration control block 335 includes control registers 872 to generate a first portion 874 of the control signals making up the configuration control bus $\mathbf{745_2}$ and a first version 874 of a second portion 886 of the control signals making up the configuration control bus $\mathbf{745_2}$. A second version 882 of the second portion 886 of the control signals making up the configuration control bus $\mathbf{745_2}$ is generated by inhibit logic 878. Inhibit logic 878 may be responsive to fuse signals or control registers 880 and an enable signal Sel−1 is w10. The enable signal Sel−1 is w10 is indicative of a desire to generate the second version 882 of the second portion 886 of the control signals when the selected word line is GWL 1, in this example. The first version 876 of the control signals 886 and the second version 882 of the control signals 886 are provided as inputs to multiplexer 884. Multiplexer 884 is responsive to control signal Inhibit Logic en to select the first version 876 of the control signals 886 when the control signal Inhibit Logic en has a first logic value and to select the second version 882 of the control signals 886 when the control signal Inhibit Logic en has a second logic value. For the foregoing example, the control signal Inhibit Logic en would be indicative of a desire to select the second version 882 of the control signals 886 when the selected word line is GWL 1. In this manner, the configuration control bus $\mathbf{745_2}$ corresponding to the Sel−1 address space could utilize a first set of control signals when most word lines are selected, but a second set of control signals when the Sel−1 address space would correspond to the first word line, i.e., GWL 0. Thus, the control signals for the Sel−1 address space could be altered based upon a position of the target access line, i.e., the selected word line GWL 1.

CONCLUSION

Memory devices have been described capable of providing a variety of control schemes to various word lines during access operations. By utilizing a plurality of configuration control buses, and multiplexing the buses to select a desired configuration control bus corresponding to an address space to which a word line belongs, flexibility is provided to enable the memory devices to be individually customized without materially changing the fabrication of the device.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A memory device, comprising:

a plurality of access lines in communication with a NAND string of memory cells; and a plurality of buses, each bus of the plurality of buses configured to supply control signals capable of driving one or more access lines of the plurality access lines;

wherein each access line of the plurality of access lines is selectively coupled to one bus of the plurality of buses during an access operation based at least on a relationship of each access line relative to a target access line of the plurality of access lines.

2. The memory device of claim 1, wherein a particular access line of the plurality of access lines is coupled to one bus if the particular access line is the target access line and coupled to a different bus if the particular access line is other than the target access line.

3. The memory device of claim 1, wherein a particular access line of the plurality of access lines is coupled to one bus if the particular access line is in a first relative position to the target access line and coupled to a different bus if the particular access line is in a second relative position to the target access line.

4. The memory device of claim 1, wherein a particular access line of the plurality of access lines is coupled to a first bus if the particular access line is the target access line, coupled to a second bus if the particular access line is one position higher than the target access line, coupled to a third bus if the particular access line is one position lower than the target access line, coupled to a fourth bus if the particular access line is two positions lower than the target access line, and coupled to a fifth bus if the particular access line is at any other position relative to the target access line.

5. The memory device of claim 1, further comprising control circuitry configured to alter the control signals to be supplied by a bus based on a position of the target access line.

6. The memory device of claim 1, wherein each bus of the plurality of buses corresponds to an address space and wherein the control circuitry is configured to allow a bus to supply control signals for driving an access line only if that access line can belong to the address space of that bus and the address space of that bus is enabled.

7. The memory device of claim 6, wherein a first address space corresponds to the target access line, a second address space corresponds to an access line one position higher than the target access line, a third address space corresponds to an access line one position lower than the target access line, a fourth address space corresponds to an access line two positions lower than the target access line, and a fifth address space corresponds to access lines at positions other than those belonging to enabled address spaces of the first, second, third and fourth address spaces.

8. The memory device of claim 7, wherein a sixth address space corresponds to access lines at a first and/or a last position of a set of access lines and wherein a bus corresponding to the sixth address space is selected for an access line at the first and/or the last position of the set of access lines if the sixth address space is enabled, regardless of whether the word line belongs to any of the second, third, fourth or fifth address spaces.

9. A memory device, comprising:

an array of memory cells;

a plurality of access lines in communication with the array of memory cells; and a plurality of buses for supplying control signals collectively capable of driving a set of access lines of the plurality of access lines;

wherein each bus of the plurality of buses corresponds to one address space within the array of memory cells;

wherein each access line of the set of access lines is assigned a particular address space in response to an access operation based at least on a relationship of that access line relative to a target access line of the plurality of access lines;

wherein circuitry for accessing the array of memory cells is configured, for each access line of the set of access lines, to select the bus of the plurality of buses corresponding to the address space of that access line to supply control signals to drive that access line during the access operation.

10. The memory device of claim 9, wherein a number of buses of the plurality of buses is less than a number of access lines of the set of access lines.

11. The memory device of claim 9, wherein the circuitry for accessing the array of memory cells is further configured, for at least one access line in a first or a last position of the set of access lines, to select one of the plurality of buses to supply control signals to drive that access line during the access operation if that access line is a target access line and to select another of the plurality of buses to supply control signals to drive that access line during the access operation if that access line is not the target access line.

12. A method of accessing a memory device, comprising:

determining an address space to which a global access line belongs during an access operation in response to a relative position of a target access line of the access operation, wherein the global access line is selectively coupled to a plurality of local access lines;

selecting a configuration control bus from a plurality of configuration control buses in response to determining the address space to which the global access line belongs;

providing control signals from the selected configuration control bus to a driver of the global access line;

selecting a potential from a plurality of potentials available to the driver of the global access line in response to the control signals of the selected configuration bus; and providing the selected potential to the global access line.

13. The method of claim 12, wherein determining the address space to which a global access line belongs comprises processing address signals of a selected global access line using combinatorial logic to generate a set of control signals indicative of an address space of an enabled set of address spaces to which the global access line belongs.

14. The method of claim 13, further comprising overriding control signals indicative of other address spaces when the global access line is the global access line at a first or last position and the selected global line is not the global access line at the first or last position.

15. The method of claim 13, wherein selecting the configuration control bus from a plurality of configuration control buses in response to determining the address space to which the global access line belongs comprises using a multiplexer to select the configuration bus in response to the set of control signals indicative of the address space of the enabled set of address spaces to which the global access line belongs.

16. The method of claim 12, further comprising:

coupling the selected potential to a local access line of the plurality of local access lines corresponding to the global access line.

17. The method of claim 12, wherein the selected potential for the global access line varies during the access operation.

18. The method of claim 12, wherein the access operation is selected from the group consisting of a read operation, a verify/read operation, a program operation and an erase operation.

19. A method of accessing a memory device, comprising:

providing sets of control signals to a plurality of configuration control buses in a one-to-one correspondence, wherein each configuration control bus corresponds to a particular address space of a plurality of addresses spaces of an access operation;

determining the address space of the plurality of address spaces to which a global access line belongs during the access operation in response to a relative position of a target access line of the access operation;

providing the set of control signals from the configuration control bus corresponding to the address space to which the global access line belongs to a driver of the global access line;

selecting a potential from a plurality of potentials available to the driver of the global access line in response to the provided set of control signals; and providing the selected potential to the global access line.

20. The method of claim 19, wherein each configuration control bus of the plurality of configuration control buses is selectively coupled to the driver of the global access line.

21. The method of claim 20, wherein each configuration control bus of the plurality of configuration control buses is further selectively coupled to a driver of another global access line.

* * * * *